United States Patent [19]
Bolte et al.

[11] Patent Number: 5,804,672
[45] Date of Patent: Sep. 8, 1998

[54] THERMALLY CROSSLINKABLE HEAT-SEALING ADHESIVE

[75] Inventors: Gerd Bolte, Monheim; Günter Henke, Neuss; Ulrike Brüninghaus, Erkrath, all of Germany

[73] Assignee: Henkel Kommanditgesellschaft auf Aktien, Duesseldorf, Germany

[21] Appl. No.: 553,569

[22] PCT Filed: May 17, 1994

[86] PCT No.: PCT/EP94/01598

§ 371 Date: Feb. 29, 1996

§ 102(e) Date: Feb. 29, 1996

[87] PCT Pub. No.: WO94/28046

PCT Pub. Date: Dec. 8, 1994

[30] Foreign Application Priority Data

May 26, 1993 [DE] Germany .......................... 43 17 470.1

[51] Int. Cl.⁶ .......................... C08F 20/00; C08F 283/04
[52] U.S. Cl. .......................... 525/438; 525/453; 525/456; 525/458; 525/528; 525/532; 525/533
[58] Field of Search .................. 525/453, 456, 525/458, 528, 532, 438, 533

[56] References Cited

U.S. PATENT DOCUMENTS

| 4,080,401 | 3/1978 | Kassner | 525/488 |
| 4,560,579 | 12/1985 | Siadat et al. | 427/45.1 |
| 4,836,878 | 6/1989 | Irving et al. | 156/307 |
| 5,223,106 | 6/1993 | Gerace et al. | 204/181.1 |

FOREIGN PATENT DOCUMENTS

| 0074218 | 4/1983 | European Pat. Off. . |
| 0519177 | 12/1992 | European Pat. Off. . |
| 2305481 | 10/1976 | France . |
| 2513378 | 9/1976 | Germany . |
| 2030991 | 4/1980 | United Kingdom . |

*Primary Examiner*—Randy Gulakowski
*Attorney, Agent, or Firm*—Ernest G. Szoke; Wayne C. Jaeschke; Martin G. Meder

[57] ABSTRACT

A mixture of an adduct of an epoxy resin and a novolak with an acrylate polymer, a modified bisphenol A or a polyol in conjunction with a polyisocyanate or a polyol of an OH-terminated polyurethane or polyester gives a heat-sealing adhesive combining high heat resistance and good hydrolysis stability with relatively high bond strengths. Accordingly, the composition is suitable above all as a base material and cover film for printed circuits.

10 Claims, No Drawings

THERMALLY CROSSLINKABLE HEAT-SEALING ADHESIVE

BACKGROUND OF THE INVENTION

1. Field of the Invention

This invention relates to a thermally crosslinkable heat-sealing adhesive based on polyurethane and to its use in electrical articles.

2. Discussion of Related Art

A heat-sealing adhesive is a heat-activatable adhesive which is applied to one or both substrates to be joined and forms a film thereon. When the substrates are heated and pressed together, the adhesive is activated so that both parts are joined to one another after cooling. Heat-sealing adhesives are based inter alia on polymers of ethylene, vinyl chloride, vinylidene chloride, vinyl acetate and (meth) acrylates and also polyamides, polyesters and polyurethanes. If it is intended to establish heat-resistant bonds, thermoplastic polymers, such as polyesters, polyamide and polyolefin, are replaced by systems which crosslink on heating—generally to 150° to 250° C.—to form thermosets, such as for example polyurethanes, copolymethacrylates, epoxy resins and phenolic resins. The heat-sealing adhesives are applied to the substrate(s) by dip coating, impregnation, spray coating or by roll coating and screen printing. The substrates in question are, above all, web-form materials of metals and plastics in the form of films/foils, textiles and papers. In this way, two or more layers of the same kind or of different kinds may generally be joined readily to one another (laminated) by calendering.

A polyurethane-based thermally crosslinkable heat-sealing adhesive is described in DE-A-25 13 378. It consists of a polyurethane or polyisocyanates, a solvent and an adduct prepared from a polyfunctional epoxy compound and novolak (see claim 1). The epoxy resins are based, for example, on diphenylol propane or epoxidized cycloaliphatic dienes. However, they may also be diazine epoxy resins. Adducts of crystallized triglycidyl isocyanurate with novolak in a ratio by weight of 30:70 to 60:40, in which the epoxy content should be from 3 to 6%, are preferred. The bonding process requires only a light pressure of 1 to 10 kp/cm$^2$ and, more particularly, 2 to 5 kp/cm$^2$, temperatures in the range from about 120° to 180° C. and times of about 2 to 30 minutes. Copper/polyimide laminates produced in this way have a solder bath resistance of at least 10 seconds at 260° C. Tensile strengths of 80 and 120 kg/cm$^2$ and peel strengths of 11 and 20 kg/cm$^2$ were measured on steel plates.

Unfortunately, this known adhesive no longer satisfies modern-day requirements. New technologies in the manufacture of printed circuits (surface assembly of components, rigid/flex circuits, remelting processes) require short-term heat resistances of 350°C. In addition, new exterior applications for laminates require improved hydrolysis stability coupled with firm adhesion to critical materials (for example fluorine-containing polymers).

Accordingly, the problem addressed by the present invention was to provide heat-sealing adhesives of which the film would be tacky or blocking-resistant, depending on the particular requirements and formulation, and which would combine high heat resistance with high stability to hydrolysis. In more general terms, the adhesive would be easy to produce and more universal in its use and would show better performance properties.

SUMMARY OF THE INVENTION

The solution provided by the invention is defined in the claims. It lies in a thermally crosslinkable heat-sealing adhesive of a mixture of a polyacrylate, a modified bisphenol A or a polyol on the one hand and an epoxy resin/novolak adduct on the other hand (component A) as reaction component for a polyisocyanate (component B) or a polyol (component C) of an OH-terminated polyurethane or polyester. The adduct consists of an epoxy resin based on bisphenol A, heterocyclic or aliphatic epoxy compounds and of novolak or bisphenol A novolak.

Component A contains a crosslinking adduct based on novolak and epoxy resin to which an acrylate polymer, a modified bisphenol A or a polyol is added.

DETAILED DESCRIPTION OF THE INVENTION

In the context of the invention, "novolaks" are acid-catalyzed polycondensation products of aldehydes and phenols which do not contain a methylol group. Suitable phenols are alkylphenols, such as cresol, xylenol, nonyl and octylphenol, or arylphenols, such as phenylphenol, or dihydric phenols, such as resorcinol and bisphenol A, and also naphthenols. Preferred phenols are bisphenol A and phenol. Suitable aldehydes include formaldehyde. Commercially available novolaks are Alnovol, Durez, Schenetady, Bakelite.

"Epoxy resins" are understood to be oligomeric compounds containing more than one epoxy group per molecule. The epoxy resins according to the invention are produced by reaction of epoxides, such as epichlorohydrin, with bisphenol A (2,2-bis-(hydroxyphenyl)-propane) with aliphatic, including cycloaliphatic, compounds, such as cyclohexanediol, or with heterocyclic compounds, such as trihydroxyethyl (isocyanurate). Examples of such epoxy resins are Rütapox, Epikote, Eurepox, Araldite types. They may be produced in known manner.

To form the adducts, the novolaks and the epoxy resins are mixed in a ratio by weight of 10:90 to 90:10 and preferably in a ratio of 30:70 to 70:30 and heated to a temperature of 70° to 180° C. and preferably to a temperature of up to 120° C. The epoxy content is from 0.5 to 50% and preferably from 1 to 5%. The OH content is from 1 to 40% and preferably from 2 to 20% OH.

Suitable acrylate polymers for the purposes of the invention are, for example, (meth) acryl/styrene/acrylonitrile copolymers or polybutyl methacrylate. The homo-polymers or copolymers of acrylic acid and methacrylic acid are also suitable. The polymers described above are particularly preferred when they have an average molecular weight of 50,000 to 300,000. Homopolymers or copolymers in which the sum of the acid value and the OH value is in the range from 1 to 200 are particularly preferred for the purposes of the invention. Particularly good results are obtained with the polymers mentioned when the sum in question is between 30 and 150 and, more particularly, in the range from 50 to 100.

Commercially available types are Desmophen, Lumitol, Acronal and the like. The ratio in which the epoxy resin and the novolak adduct are mixed is in the range from 0.1:100 to 100:10 and preferably in the range from 0.2:100 to 60:40.

The "modified bisphenol A" is a reaction product derived from bisphenol A and diols. The diol may have the general formula HO—ROH, where R is an alkylene radical containing up to 50 carbon atoms and preferably up to 10 carbon atoms. However, it may also be a polyalkylene glycol with the general formula H(O—R$^1$)$_n$OH, where R$^1$ is an ethylene, propylene or butylene group and n is a number of 1 to 12 and, more particularly, 1 to 6.

The bisphenol A is preferably reacted with one to twelve times the molar quantity of ethylene oxide or propylene oxide. Modified bisphenol A products such as these are commercially available as Dianols. In addition, the bisphenol A may also be modified by condensation with formaldehyde, resulting in the formation of resols or novolaks of the type already described.

"Polyols" are understood to be the polyols typically encountered in polyurethane chemistry. Of these, the polyester diols and polyether diols, especially polypropylene glycol, are particularly suitable. The diols should have an OH value of 1 to 2,000.

The "polyisocyanates" are compounds containing 2 or more and preferably 2 or 3 free or blocked isocyanate groups. In the case of the blocked isocyanate groups, the isocyanate group is available after exposure to heat.

Specific examples are Desmodur, Basomat, Vestanat, Scuranate, Desmocap.

"Polyurethane prepolymers" are understood to be oligomeric polyurethane compounds containing an average of 2 to 10 and, more particularly, 2 to 4 urethane groups per molecule. They may be prepared in known manner from a polyol, more particularly a diol, and a polyisocyanate, more particularly a diisocyanate. Suitable polyols are polyesters, polyethers, heterocycles, bisphenol A polyols, aliphatic and aromatic alcohols (1-n-functional). Of these, polyesters and polyethers are preferred. Suitable polyisocyanates are MDI, TDI, IPDI, HDI, TMXDI, naphthyl diisocyanates, etc. of these, MDI, TDI and IPDI are preferred. The ratio of polyol to polyisocyanate should be selected in such a way that prepolymers containing 2 to 6 and preferably 2 to 4 NCO groups per molecule of prepolymer are formed. Specific examples of NCO-terminated polyurethane prepolymers are Liofol UK 3645, UR 3690, UR 3850, UR 7740, UR 7750.

The polyol of an OH-terminated polyurethane prepolymer or polyester has an OH value of 1 to 200 and preferably 1 to 70 and an average molecular weight (Mn) in the range from 500 to 100,000 and preferably in the range from 1,000 to 30,000. Commercially available types are Liofol, Desmophen, Luphen, Dynacoll.

Depending on the particular application and upon the functionality, component A is mixed with component B or C in a ratio by weight of 1:50 to 50:1 and preferably in a ratio by weight of 1:20 to 20:1.

In addition to these two essential components A) and B) or C), the heat-sealing adhesive may also contain other components of which the type and quantity are determined by the particular application. For example, polyesters, polyethers, polyepoxy resins, NBR rubber are added to influence film hardness and resistance. Other additives are, for example, silanes, flow control agents, foam inhibitors, flameproofing agents, stabilizers or accelerators.

The heat-sealing adhesive according to the invention is prepared by mixing the components either in the absence of a solvent or even in the presence of a solvent should this appear appropriate in any particular case. Suitable solvents are ketones, such as acetone, methylethyl ketone, isobutylmethyl ketone, or esters, such as ethyl acetate or propyl acetate, and chlorinated hydrocarbons, such as methylene chloride, 1,2-dichloroethane and trichloroethylene. Other inert solvents, such as hydrocarbons, for example toluene or cyclohexane, may of course also be used.

The adhesives according to the invention may be applied by dip coating, impregnation or spray coating and also by roll coating and screen printing. However, films may also be initially prepared by applying the mixtures to silicone paper or other anti-adhesively treated materials and removing the film from its support after evaporation of the solvent. In this way, it is possible on the one hand to produce coatings on materials to be bonded and, on the other hand, to form adhesive films which are best separated from their support only just before they are to be used.

Depending on the type of mixture, a tacky or non-blocking adhesive film is obtained and may be activated by application of heat and pressure.

In the case of mixtures of components A and B, crosslinking actually occurs during formation of the film or rather during its storage at room temperature in the form of an OH/NCO reaction which is subsequently completed by curing at elevated temperatures at which even the epoxide groups react.

The advantages of the composition according to the invention over the composition known from DE 25 13 378 are:

the possibility of making the film blocking-resistant,
considerably improved heat resistance,
higher hydrolysis stability and
lower activation and curing temperatures, depending on the substrate.

In addition, the adhesive according to the invention also has at least equally good properties in regard to flexibility and adhesion to various substrates, even without a solvent.

By virtue of these advantages, the heat-sealing adhesives according to the invention are suitable not only for coating
metal foils, for example of copper, aluminium and constantan,
plastic films, for example polyimide, polyethylene terephthalate, polyphenyl sulfide, PES (polyether sulfone), PEEK (polyether ether ketone) and fluorine polymers (PTFE, PVF, PVDF),
woven fabrics and nonwovens of fibers of polyethylene terephthalate, glass and aromatic polyamides and
papers, presspahn sheets and polyaramide paper,
but also as adhesives and insulators in the electrical and electronics industries, for example
for the production of flat cables and cable sheaths,
for the insulation of electrical circuits and components,
as adhesive films for multilayer materials and
as a base material or cover film for printed circuits.
The invention is illustrated by the following Examples.

I) Production and description of the starting products 1. a) Novolak-based epoxy resin
   Commercially available novolak-based epoxy resins, such as Araldite xPS 307 for example, were used.
1. b) Acrylate copolymer
   Commercially available acrylate copolymers or terpolymers, such as Lumitol M 81 or Desmophen A 450, were used.
2. Preparation of the adduct
   a) Epoxy resin based on bisphenol A/bisphenol A-novolak adduct
      A mixture of an epoxy resin with a bisphenol A novolak in ethyl acetate was heated under reflux in an addition reaction.
   b) Epoxy resin based on bisphenol A/novolak adduct
      see 2. a)

3. Preparation of the NCO-terminated polyurethane prepolymers
   a) Polyester urethane prepolymer
      Commercially available OH-terminated polyesters were reacted with a diisocyanate in an NCO:OH addition ratio of 2:1.
   b) Polyisocyanate
      Commercially available polyfunctional polyisocyanates, such as Desmodur VK, L, N. E, Vestanat T 1890, Basonat A 270, were used.
   c) OH-terminated polyesters or polyurethane prepolymers
      OH-terminated polyesters, such as Durocol S, L or Desmophen types, were used either directly or after reaction with a diisocyanate (OH:NCO addition ratio=2:1).

II) Production and Use of the Adhesive 4.1 A mixture of 10 parts by weight of the NCO-terminated polyester urethane prepolymer 3a) with a mixture of 4 parts by weight of the adduct 2a) and 1 part by weight of the novolak-based epoxy resin (1a) and 0.02 part by weight of the acrylate (1b) was applied by knife-coating to a 35 $\mu$m copper foil from a 40% solution in ethyl acetate. Removal of the solvent by hot air over a period of about 2 minutes left a compact, non-blocking film with a thickness of 20 $\mu$m.

4.2 The lamination of this coated copper foil with a polyimide film for 0.5 h under a pressure of 20 bar at a temperature of 170° C. produced a bond characterized by very good heat resistance (>60 s/260° C. and >5 s/288° C. in a solder bath) and bond strength (material destroyed during separation).

4.3 The copper foil coated in accordance with 4.1 was laminated with a PET film for 10 minutes under a pressure of 20 bar at a temperature of 120° C. The bond showed good heat resistance (>30 s/230° C. in a solder bath) and high strength (material failure occurred during separation).

4.4 Application of the adhesive system described in 4.1 to a 23 $\mu$m PETP film produced a compact, non-blocking film approximately 12 $\mu$m thick after removal of the solvent. Lamination with polyaramide paper for 10 minutes under a pressure of 20 bar at a temperature of 90° C. produced a bond which showed fiber tearing immediately after lamination. The bond also shows high heat resistance (>48 h at 180° C).

4.5 A mixture of 10 parts by weight of the NCO-terminated polyester urethane prepolymer 3a) with a mixture of 4.6 parts by weight (pbw) of the adduct 2a), 0.4 pbw of the novolak-based epoxy resin (1a) and 0.01 pbw of the acrylate copolymer (1b) was applied by knife coating to a 20 $\mu$m aluminium foil from a 40% solution in ethyl acetate. Removal of the solvent by hot air over a period of approximately 2 minutes left a compact, tacky film with a thickness of 10 $\mu$m.

4.6 The lamination of this aluminium foil with a polyester film at 70° C. produced a bond strength of 10N/15 mm after crosslinking for 1 week at room temperature and heating for 1 hour (h) at 120° C. After the bond had been exposed to a temperature of 128° C. for 50 h in water, it still had 70% of its original strength.

5.1 A mixture of 10 parts by weight of the NCO-terminated polyurethane prepolymer 3b) with a mixture of 4 parts by weight of the adduct 2b) and 1 part by weight of the novolak-based epoxy resin (1) and 0.02 part by weight of the acrylate copolymer (1b) was applied by knife coating to a 35 $\mu$m thick copper foil from a 40% solution in ethyl acetate. Removal of the solvent by hot air over a period of 2 minutes left a compact, non-blocking film with a thickness of 20 $\mu$m.

5.2 The lamination of the copper foil coated in accordance with 5.1 with a polyimide film for 30 minutes under a pressure of 20 bar at a temperature of 170° C. produced a bond having very good heat resistance (>60 s/260° C. and >30 s/288° C. in a solder bath) and high strength (separation not possible without material failure).

5.3 The copper foil coated in accordance with 5.1 was laminated with a PETP film for 10 minutes under a pressure of 20 bar at a temperature of 120° C. The bond showed high heat resistance (60 s/230° C. in a solder bath) and high strength (separation not possible without material failure).

6.1 10 pbw of a mixture of 8 pbw of the adduct (2b) with 2 pbw of the novolak-based epoxy resin (1a) and 5 pbw of the acrylate copolymer (1b) with 3 pbw of a polyisocyanate (3b) was applied by knife coating to a 35 $\mu$m thick copper foil from a 40% solution in ethyl acetate. Removal of the solvent by hot air over a period of about 2 minutes left a compact, non-blocking film with a thickness of 20 $\mu$m.

6.2 The lamination of this coated copper foil with a polyimide film for 0.5 h under a pressure of 20 bar at a temperature of 170° C. produced a bond of excellent heat resistance (>60 s at 350° C. in a solder bath) and bond strength (separation only possible with material failure).

7.1 A mixture of 50 pbw of a polyester 3c with a mixture of 4 parts by weight of the adduct 2a), 1 pbw of the novolak-based epoxy resin (1a) and 0.02 pbw of the acrylate copolymer (1b) was applied to a 25 $\mu$m thick PET film. Removal of the solvent by hot air over a period of about 2 minutes left a compact, non-blocking film with a thickness of 20 $\mu$m.

7.2 The coated PET film was sealed with the layer side against a copper foil for 1 s under a pressure of 4 bar at 130° C. After the bond formed had been heated for 1 hour at 130° C., it could only be separated with material failure and showed a short-term resistance of >10 s at 230° C. in a solder bath.

III Comparison Tests

Example 3 of DE-A-25 13 378 was used for comparison.

8.1 The lamination of a cu foil with a polyimide film produced a solder bath resistance of 60 s at 260° C. and 15 s at 288° C. and a bond strength of 16N/15 mm.

8.2 The lamination of an aluminium foil with a polyester film showed delamination after 50 h in water at 128° C. The adhesive film was not resistant to blocking after application either in test 8.1 or in test 8.2.

The comparison shows:

The adhesives according to the invention can be made resistant to blocking and, accordingly, require no cover films in contrast to known adhesives.

The short-term heat resistance (solder bath) is considerably higher.

Better hydrolysis stability was achieved.

The bond strength values are distinctly higher.

The properties of the films were determined as follows:

Bond strength was determined by the peel test (90° separation angle, 15 mm test strip).

Heat resistance was determined by
a) storing the bond for 48 h at the test temperature in a drying cabinet or
b) immersing the bond in a lead/tin bath heated to the corresponding temperature.

Blocking resistance was determined by pressing the adhesive film against a substrate after drying.

Storability was determined by comparing the properties of the fresh product with a stored product.

We claim:

1. A composition useful as a thermally crosslinkable heat-sealing adhesive comprising a mixture of the following components:

Component A):
   a mixture of:
      1) an adduct of:
         a) an epoxy resin selected from the group consisting of bisphenol A epoxy compounds, aliphatic epoxy compounds, and heterocyclic epoxy compounds, and
         b) a member selected from the group consisting of a novolak and a condensation product of bisphenol-A and an aldehyde, with
      2) a member selected from the group consisting of an acrylate polymer, a reaction product of bisphenol-A and a diol, and a polyol, and
Component B):
   a member selected from the group consisting of polyisocyanates, a hydroxyl-terminated polyurethane prepolymer, and a hydroxyl-terminated polyester.

2. A composition as claimed in claim 1 wherein said polyisocyanate is an isocyanate-terminated polyurethane prepolymer containing 2 to 10 urethane groups per molecule.

3. A composition as claimed in claim 1 wherein component A is liquid at room temperature.

4. A composition as claimed in claim 1 wherein said epoxy resin has a linear molecular chain.

5. A composition as claimed in claim 1 wherein said polyol of component A has an OH value of 1 to 200.

6. A composition as claimed in claim 1 wherein said member selected from the group consisting of an acrylate polymer, a reaction product of bisphenol-A and a diol, and a polyol has a sum of acid and OH values of 1 to 200.

7. A composition as claimed in claim 1 wherein the ratio by weight of said member selected from the group consisting of an acrylate polymer, a reaction product of bisphenol-A and a diol, and a polyol to said adduct is 0.1:100 to 100:10.

8. A composition as claimed in claim 1 wherein the ratio by weight of component A to component B is 1:50 to 50:1.

9. A composition useful as a thermally crosslinkable heat-sealing adhesive comprising a mixture of the following components:

Component A):
   a mixture, said mixture being a liquid at room temperature, of;
      1) an adduct of:
         a) an epoxy resin having a linear molecular chain and selected from the group consisting of bisphenol A epoxy compounds, aliphatic epoxy compounds, and heterocyclic epoxy compounds, and
         b) a member selected from the group consisting of a novolak and a condensation product of bisphenol-A and an aldehyde, with
      2) a member having an acid value, an OH value, or both an acid value and an OH value, having a sum of acid and OH values of 1 to 200, and being selected from the group consisting of an acrylate polymer, a reaction product of bisphenol-A and a diol, and a polyol, said polyol having an OH value of 1 to 200,
   wherein the ratio by weight of said member selected from the group consisting of an acrylate polymer, a modified bisphenol A, and a polyol to said adduct is 0.1:100 to 100:10, and
Component B):
   a member selected from the group consisting of an isocyanate-terminated polyurethane prepolymer containing 2 to 10 urethane groups per molecule, a hydroxyl-terminated polyurethane prepolymer, and a hydroxyl-terminated polyester, wherein the ratio by weight of component A to component B is 1:50 to 50:1.

10. A method of making a composition useful as a thermally crosslinkable heat-sealing adhesive comprising a mixture of the following components:

Component A):
   a mixture of:
      1) an adduct of:
         a) an epoxy resin selected from the group consisting of bisphenol A epoxy compounds, aliphatic epoxy compounds, and heterocyclic epoxy compounds, and
         b) a novolak or condensation product of bisphenol-A and an aldehyde, with
      2) a member selected from the group consisting of an acrylate polymer, a reaction product of bisphenol-A and a diol, and a polyol, and
Component B):
   a member selected from the group consisting of polyisocyanates, a hydroxyl-terminated polyurethane prepolymer, and hydroxyl-terminated polyester.

* * * * *